United States Patent
West et al.

(10) Patent No.: US 11,270,366 B2
(45) Date of Patent: Mar. 8, 2022

(54) GRAPHICAL USER INTERFACE FOR CREATING BUILDING PRODUCT LITERATURE

(71) Applicant: Oldcastle BuildingEnvelope, Inc., Dallas, TX (US)

(72) Inventors: William L. West, Brooklyn, NY (US); David C. Anderson, Sunnyside, NY (US); Mark T. Green, New York, NY (US); Joshua M. Weber, South Jordan, UT (US); Nathan B. Creech, Dallas, TX (US)

(73) Assignee: Oldcastle BuildingEnvelope, Inc., Dallas, TX (US)

( * ) Notice: Subject to any disclaimer, the term of this patent is extended or adjusted under 35 U.S.C. 154(b) by 28 days.

(21) Appl. No.: 16/286,314

(22) Filed: Feb. 26, 2019

(65) Prior Publication Data
US 2019/0266653 A1    Aug. 29, 2019

Related U.S. Application Data

(60) Provisional application No. 62/635,532, filed on Feb. 26, 2018.

(51) Int. Cl.
*G06F 3/0481* (2013.01)
*G06F 3/0346* (2013.01)
(Continued)

(52) U.S. Cl.
CPC ....... *G06Q 30/0623* (2013.01); *G06F 3/0482* (2013.01); *G06F 3/04845* (2013.01);
(Continued)

(58) Field of Classification Search
CPC .... G06Q 30/0623; G06Q 10/06; G06Q 30/02; G06Q 30/0621; G06Q 30/0643;
(Continued)

(56) References Cited

U.S. PATENT DOCUMENTS

| | | | |
|---|---|---|---|
| 2012/0133653 A1* | 5/2012 | Gossweiler, III | ....... G06F 30/00 345/419 |
| 2013/0282511 A1* | 10/2013 | Mitchell | ............ G06Q 30/0611 705/26.4 |

(Continued)

FOREIGN PATENT DOCUMENTS

| WO | 01/55831 A1 | 8/2001 |
|---|---|---|
| WO | 2011/066452 A2 | 6/2011 |

(Continued)

OTHER PUBLICATIONS

PCT/US2019/019642 received an International Search Report and Written Opinion, dated May 10, 2019, 9 pages.

*Primary Examiner* — Jennifer N Welch
*Assistant Examiner* — Kc Chen
(74) *Attorney, Agent, or Firm* — Weaver Austin Villeneuve & Sampson LLP

(57) ABSTRACT

A user interface is described that enables a user to select and visualize different configurations of building products, perform a visual comparison of different configurations, save views of visualizations of the configurations, and obtain building product literature of the materials in the configurations. In some embodiments, the user interface can identify contractors for a user and facilitate communication with the contractors.

18 Claims, 7 Drawing Sheets

(51) Int. Cl.
*G06F 3/0338* (2013.01)
*G06F 3/01* (2006.01)
*G06T 7/50* (2017.01)
*G06Q 30/06* (2012.01)
*G06F 3/0482* (2013.01)
*G06F 3/04845* (2022.01)
*G06F 3/04847* (2022.01)
*G06Q 10/06* (2012.01)
*G06Q 50/08* (2012.01)
*G06Q 30/02* (2012.01)
*G06F 30/13* (2020.01)

(52) U.S. Cl.
CPC .......... *G06F 3/04847* (2013.01); *G06F 30/13* (2020.01); *G06Q 10/06* (2013.01); *G06Q 30/02* (2013.01); *G06Q 30/0621* (2013.01); *G06Q 30/0643* (2013.01); *G06Q 50/08* (2013.01); *G06F 2203/04803* (2013.01)

(58) Field of Classification Search
CPC ....... G06Q 50/08; G06F 30/13; G06F 3/0482; G06F 3/04845; G06F 3/04847; G06F 2203/04803
See application file for complete search history.

(56) References Cited

U.S. PATENT DOCUMENTS

| | | | |
|---|---|---|---|
| 2014/0095122 A1* | 4/2014 | Appleman | G06F 30/13 703/1 |
| 2014/0173508 A1* | 6/2014 | Berry | G06F 3/0485 715/794 |
| 2015/0324940 A1* | 11/2015 | Samson | G06Q 10/08 705/7.23 |
| 2017/0316093 A1* | 11/2017 | Carrillo | G06F 16/958 |
| 2019/0138995 A1* | 5/2019 | Currin | G06Q 10/103 |

FOREIGN PATENT DOCUMENTS

| | | |
|---|---|---|
| WO | 2012/162442 A2 | 11/2012 |
| WO | 2019/164547 | 8/2019 |

\* cited by examiner

100-B

CONFIGURATION

System — OBE System 01

Frame — Double Glazed Configuration
Top Channel: Bronze Anodized Aluminum
Bottom Channel: Black Powder Coat
Vertical Channel: Bronze Anodized Aluminum Glass — 2 x 1/2" Laminated
Acid Etch on #4 Surface Doors — Overhead Closer: Bronze Finish
Locking Ladder Pull: Stainless Steel with Leather Wrap
Dustproof Strike: Stainless Steel Finish Integrations — Touch Switch on Sidelite Adjacent to Door
Transparent OLED

155

DETAILS

Section           Plan

FIG. 1B

GRAPHICAL USER INTERFACE FOR CREATING BUILDING PRODUCT LITERATURE

RELATED APPLICATION

This application claims the benefit of U.S. Provisional Application No. 62/635,532, filed Feb. 26, 2018, entitled "Graphical User Interface for Creating Building Product Literature," which is assigned to the assignee hereof, and incorporated herein in its entirety by reference.

BACKGROUND

The process of selecting building products for use in a project can be complex. An architect, engineer, contractor, materials, purchaser, etc. may have difficulty visualizing the various options for building products in a real-world application. Visualization tools capable of showing illustrations of how different products may look in different settings may therefore be beneficial to help a person to determine how to customize products for purchase. Even so, traditional visualization tools often fail to allow a user to view a user-selected configuration of one or more building products, enable an easy comparison of different building products, or allow users to easily obtain building product literature regarding the customized configuration of building products.

BRIEF SUMMARY

Embodiments of the invention described herein address these and other issues by providing for user interface that enables a user to visualize different configurations of building products, perform a visual comparison of different configurations, save views of visualizations of the configurations, and obtain building product literature of the materials in the configurations.

An example method of providing a user interface for creating building product literature, according to the disclosure, comprises causing a visualization to be displayed in a graphical user interface, where the visualization comprises an initial view, from a plurality of views selectable via the graphical user interface, of one or more configurable building products in an environment having one or more contextual features. The method further comprises receiving, via the graphical user interface, a user selection indicative of a configuration of the one or more configurable building products, the selected configuration representing a selected product option for at least one of the one or more configurable building products. The method also comprises, in response to receiving, via the graphical user interface, user input indicative of a selected view of the plurality of views, causing the visualization to show the selected view, receiving a user input, via the graphical user interface, to save the selected view, and cause the graphical user interface to display building product literature comprising the saved view, and a description of the selected product option for the at least one of the one or more configurable building products of the selected configuration.

An example computer system, according to the disclosure, comprises a memory and a processing unit communicatively coupled with the memory. The processing unit is configured to cause a visualization to be displayed in a graphical user interface, where the visualization comprises an initial view, from a plurality of views selectable via the graphical user interface, of one or more configurable building products in an environment having one or more contextual features. The processing unit is further configured to receive a user selection via the graphical user interface, wherein the user selection is indicative of a configuration of the one or more configurable building products, and the selected configuration represents a selected product option for at least one of the one or more configurable building products. The processing unit is also configured to, in response to receiving, via the graphical user interface, user input indicative of a selected view of the plurality of views, cause the visualization to show the selected view, receive a user input, via the graphical user interface, to save the selected view; and cause the graphical user interface to display building product literature comprising the saved view, and a description of the selected product option for the at least one of the one or more configurable building products of the selected configuration.

BRIEF DESCRIPTION OF THE DRAWINGS

For a more complete understanding of this invention, reference is now made to the following detailed description of the embodiments as illustrated in the accompanying drawings, in which like reference designations represent like features throughout the several views and wherein:

FIGS. 1A-1C are screen captures of a user interface for creating building product literature, according to an embodiment;

In the appended figures, similar components and/or features may have the same reference label. Further, various components of the same type may be distinguished by following the reference label by a dash and a second label that distinguishes among the similar components. If only the first reference label is used in the specification, the description is applicable to any or all of the similar components having the same first reference label irrespective of the second reference label.

DETAILED DESCRIPTION OF THE INVENTION

The ensuing description provides embodiments only, and is not intended to limit the scope, applicability or configuration of the disclosure. Rather, the ensuing description of the embodiments will provide those skilled in the art with an enabling description for implementing an embodiment. It is understood that various changes may be made in the function and arrangement of elements without departing from the scope. In particular, although particular embodiments of a user interface are provided herein, the layouts and functionality of user interfaces in alternative embodiments can vary.

As used herein, the term "building products," may refer to any of a variety of materials used in the construction of buildings and/or other structures. These products can include, for example and without limitation, commercial and/or residential products relating to an aesthetic design (often referred to as "architectural products") and/or having a particular utilitarian function. A person of ordinary skill in the art will appreciate that this description may pertain to various types of products.

Additionally, the term "building product literature" as used herein may refer to any of a variety of literature used for the construction of building and/or other structures. This literature may include, for example and without limitation, a specification document, a product brochure, a "cut sheet," detail drawings, and/or other types of documentation related to materials used in construction. Building product literature may not be limited to physical media (e.g., a printed document, brochure, or other "hard copy"), but may also include electronic media (e.g., electronic files comprising pictures, documents, and the like), including "soft copies" of physical media. Again, a person of ordinary skill in the art will appreciate that this description may pertain various types of literature related to building products.

Figure 1A:
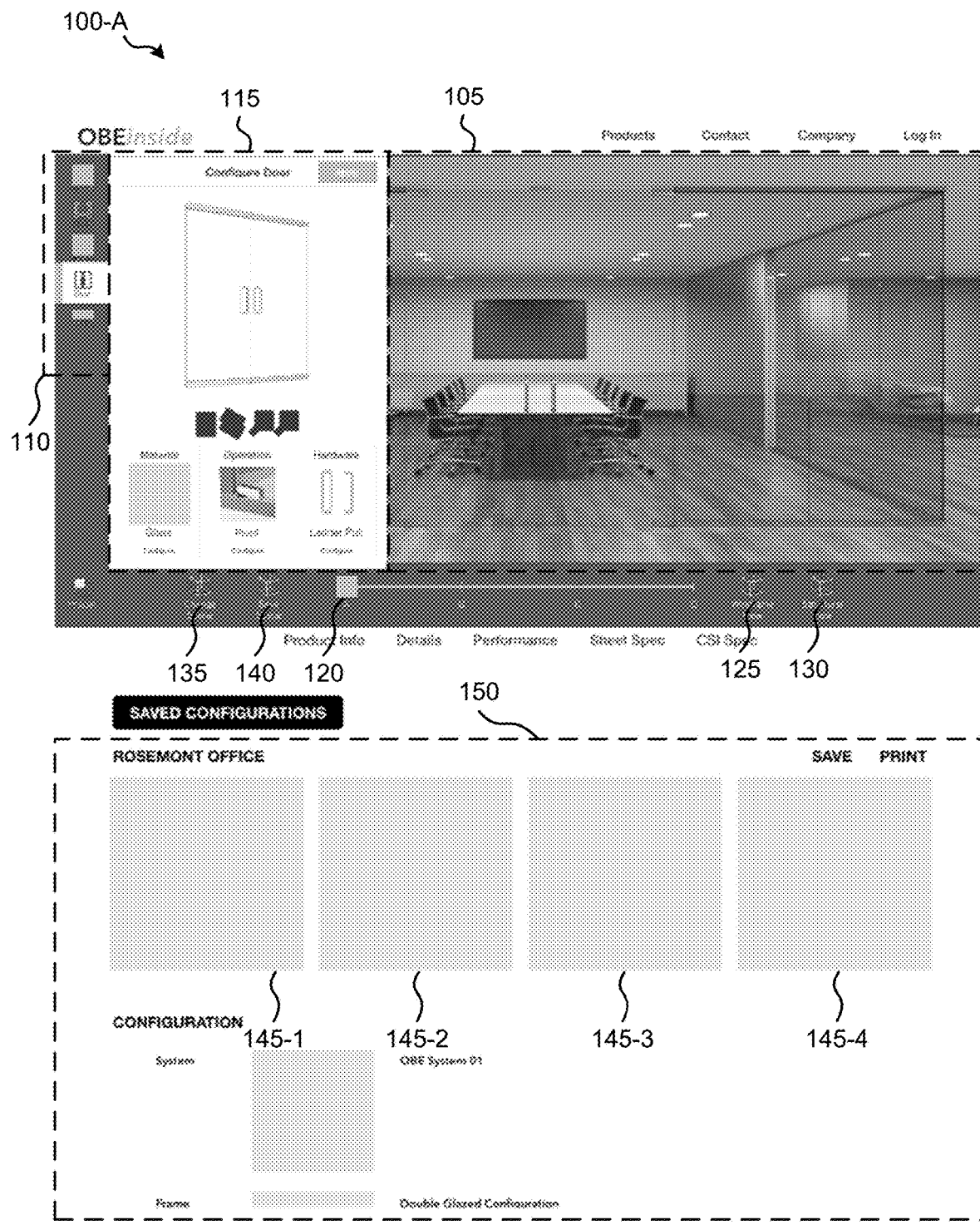
Figure 1C:
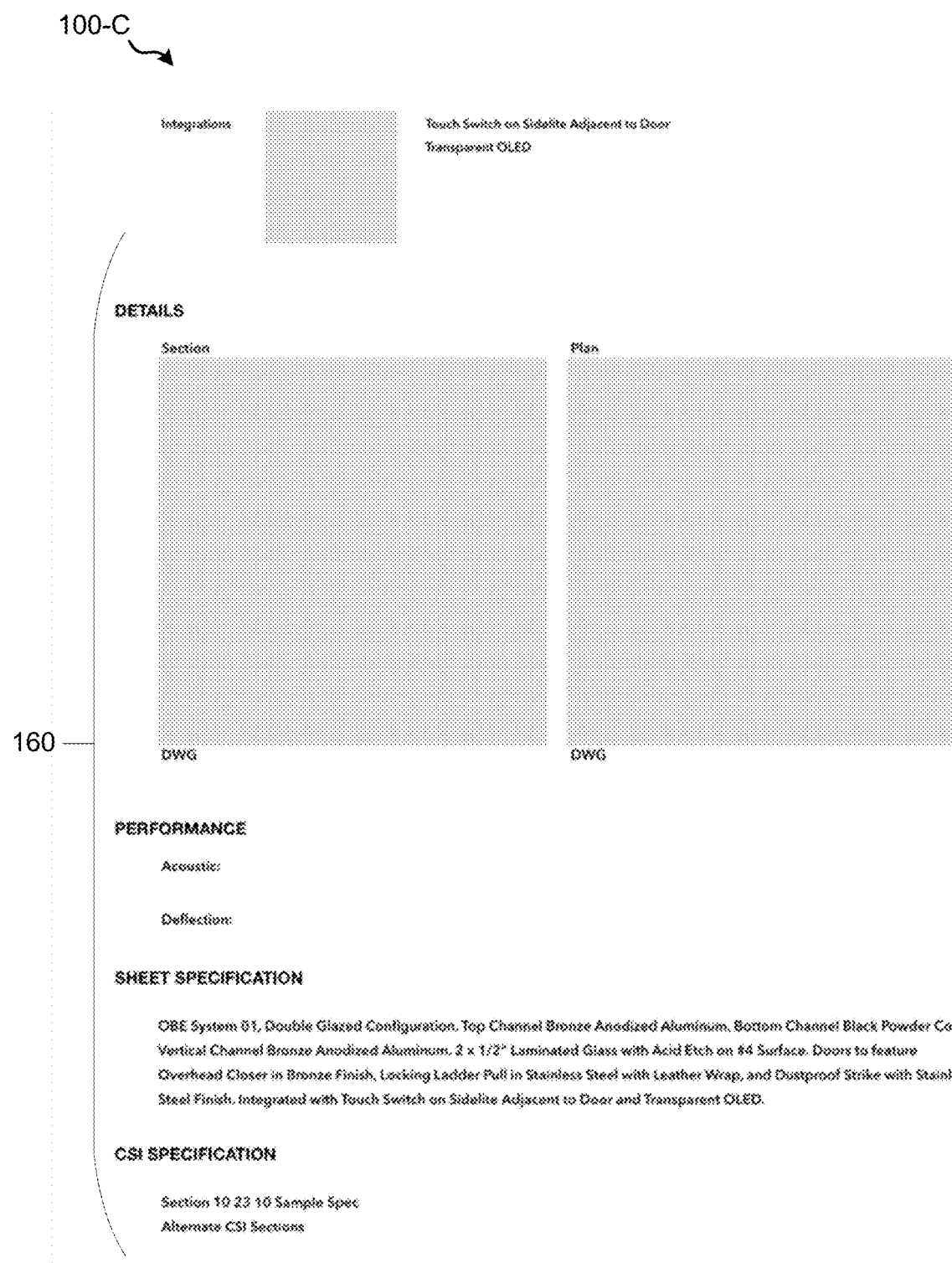

FIGS. 1A-1C are screen captures of portions of a user interface 100-A, 100-B, and 100-C (collectively and generically referred to herein as user interface 100) for visualizing various building products and creating building product literature for selected building products, according to an embodiment. Here, the bottom portion of FIG. 1A overlaps with the top portion of FIG. 1B, and the bottom portion of FIG. 1B overlaps with the top portion of FIG. 1C (duplicate features in the portions show where these portions overlap), thereby illustrating different portions of a single user interface 100. Different portions of the user interface 100 may be shown on a display of an end-user device (e.g., personal computer, laptop, tablet, mobile phone, etc.), and a user may scroll upward and downward, for example, to navigate through the entire user interface. Gray boxes in FIGS. 1A-1C (e.g., 145-1 to 145-4) indicate locations within the user interface 100 that can be populated with images and/or text related to the configuration of building products selected by the user. Additional details are described herein below.

As noted above, alternative embodiments may include configurations different than those illustrated here. Components within the user interface 100 may be added, omitted, combined, separated, etc., and other variations may exist in alternative embodiments. For example, in some embodiments, controls 120-140 may be located on the right- or left-hand side of the user interface 100 and/or configuration menu 110 may be located above or below the visualization 105 portion. In some embodiments, controls 120-140 may be included within the configuration menu 110. Other rearrangements of the various components of the user interface 100 may be made additionally or alternatively, depending on desired functionality, aesthetic preference, and/or other factors.

According to some embodiments, this user interface may be provided via a webpage, accessible to users via a computing device, such as a personal computer, tablet, mobile phone, etc. In some embodiments, more simplified versions of the user interface 100 may be displayed on devices with smaller screens, and a server hosting the webpage may provide these simplified user interfaces based on information regarding the device displaying the webpage (e.g., operating system (OS), browser type, device type, etc.). In alternative embodiments, the user interface may be provided via an application executed by an end user device or terminal, and/or a client application in communication with a server application executed by a remote device (e.g., a computer server).

Depending on desired functionality, a user may choose to remain anonymous or may set up a user account. In instances where a user sets up an account, information can be saved by the user and associated with the corresponding user account. This information may include, for example, identifying information for the user (e.g., name, email address, phone number, etc.), information regarding the user's interaction with the user interface (e.g., saved product configurations, building product literature, views, etc.), and the like. In some embodiments, anonymous users may not have the same functionality as users logged in with an account. That said, in some embodiments, anonymous users may still be able to save and/or retrieve information (views, configurations, etc.) using, for example, local storage of an end-user device. Users with an account, on the other hand, may be able to provide custom names for saved information and/or synchronized saved information between multiple end-user clients and/or devices.

According to embodiments, a first portion of a graphical user interface 100 may include a visualization 105 in which one or more configurable building products in an environment, or "scene," having one or more contextual features. In the illustrated example, building products include the doors, glass, frames, and other objects within the visualization. One or more of these products may be configurable to show different available options for purchase, including different materials, finishes, designs, etc. for these different products. The visualization 105 of the graphical user interface 100 may further show these configurable building products in an environment having one or more contextual features, such as floor type, wall and ceiling colors and materials, furniture and lighting fixtures, a city context and the like, which can help the visualization show a realistic real-world application in which the building products may be used.

Here, the user may decide which building products to use in a construction project by selecting different configurations of building products, and viewing the visualization provided by the graphical user interface 100. As the user selects different configurations, these changes may be reflected in the visualization. In the illustrated embodiment, a configuration menu 110 is provided, enabling a user to select the building product to customize. (Contextual features shown in the visualization may be customized in a similar manner.) When a user selects a button on the configuration menu corresponding to an building product, a corresponding customization window 115 may appear, enabling the user to further select one or more particular options for the building product and apply it so that the selected option(s) for the product is/are reflected in the visualization 105.

The visualization may be customizable to show different scenes in which building products and contextual features are displayed. One scene may be of a boardroom, another scene may be of an office, another may be of a lobby, etc. As used herein these scenes may be referred to as "stations" (or sometimes "vignettes") and may comprise a logically interconnected set of "views," where each view shows the building products and contextual features of the visualization from a different perspective. The user interface 100 enables a user to select different views of a station, and a user may navigate through these different views using virtual buttons, dials, and/or other controls provided in the user interface.

It can be noted that the types of stations available for a visualization may vary by application, depending on the types of building products available to configure. For example, an application in which glass and glazing systems are sold may include stations illustrating a boardroom, office, lobby, and the like, as discussed above, to be able to highlight such products. An application in which building products include shutters and awnings may include indoor and/or outdoor stations illustrating windows, entryways, patios, etc. Applications including building materials, such as structural components, that may not be visible after construction is complete may include stations that allow the building materials to be viewed, including stations showing various stages of construction/assembly, section views, cutaway views, exploded views, etc.

The importance of visualization in this context cannot be overstated. Traditional user interfaces for building product selection may enable user to select a given product and retrieve associated product literature for the product, embodiments here provide visualizations that not only help the user of the user interface 100 to visualize a certain configuration of building products, but can also allow the user to obtain image captures of these visualizations. These image captures can be included in the product literature and provided to the user's customers, and can be of key importance when deciding on which product configuration to use. As such, embodiments herein provide, among other things, enhanced user experience and accessibility for determining building product configurations.

In the example illustrated in FIG. 1A, a sliding control 120 is provided to allow the user to navigate between different views. The available views may vary, depending on the station and/or the building products shown therein. As noted above, the views for a station may comprise a logically interconnected series of images that provide different viewpoints of the station. For instance, a station may include a set of views comprising images with different linear viewpoints in which the location of the viewpoints changes with respect to the objects (e.g., the configurable building products) of a station displayed in the visualization (e.g., along an x, y, and/or z axis) but the orientation of the viewpoints remains substantially the same), panoramic viewpoints in which the orientation of the viewpoints can change but the location of the viewpoints remains the same with respect to the objects of the station, orbital viewpoints in which the orientation and location of the viewpoints rotate around ("orbit") objects of the station while oriented toward the objects, any other set of geometric constraints on the location and orientation of the viewpoints, and/or any combination thereof.

Additional selectable buttons in the user interface provide access to additional modes of visualization. For instance, the wireframe view button 125 can provide a wireframe view (not shown) of one or more objects of a station. The structural view button 130 can provide a simulated "cutaway" or "x-ray" view revealing structural components or other components not normally visible when installation of the building products is completed.

Alternative embodiments may include additional or alternative modes of visualization, which may vary depending on application, and which may be accessible via buttons similar to buttons 125 and 130. For example, some embodiments may provide a false color mode of visualization, which can be beneficial in illustrating thermal absorption, transmittance, radiance, illuminance, or other properties related to the selected building products. Some embodiments may provide a vector field, which may be beneficial in showing structural deflection, stress, and/or other physical properties that may vary relative to a position on a surface shown in the visualization 105. Some embodiments may provide a schematic view, which can provide some details that may not be visible in a standard (photorealistic) view.

In some embodiments, the views navigable using the sliding control 120 may vary, depending on the mode of visualization. For example, For certain stations and/or building products, it may be beneficial to display an exploded or broken out section view (e.g., to show otherwise hidden features). In such instances, the sliding control 120 may allow a user to navigate from a standard view of the station and/or building products to the broken out section view or exploded view, and various stages in between.

Additionally or alternatively, the placement and/or state of a building material may be adjusted via the graphical user interface 100. A user may do this, for example, by adjusting a control (not shown) in the graphical user interface 100 and/or providing certain user input (e.g., mouse movement, touchscreen gesture, etc.). Adjusting the placement and/or state of the building material may vary, depending on the mode of visualization, the type of building material, the station shown in the visualization 105, and the like. For example, for a station showing a shutter or awning, a user may be able to manipulate a control or provide another type of input to adjust the shutter or awning from 0% open to 100% open, and various stages in between. This may alter various aspects of the visualization 105, such as light, thermal transmittance, etc., which may vary depending on the type of visualization mode shown in the visualization 105. For example, opening a shutter may adjust the lighting of a scene shown in a standard visualization mode.

The change scene button 135 may alter the types and/or arrangement of objects displayed in the visualization altogether, for example by switching to a different station. For instance, a first station may comprise a boardroom (as illustrated in FIG. 1A), while other selectable stations may comprise an office, building, lobby, etc. Different stations may have different configurable building products and contextual features, as well as different available views. For example, the station showing the scene of the boardroom illustrated in FIG. 1A may provide a set of views having orbital viewpoints around the boardroom, while a station showing a scene of an office (not illustrated) may provide a set of views having linear viewpoints, allowing a user to pan along a hallway that passes the office. Additionally or alternatively, different stations may have different visualization modes.

The save scene button 140 may enable the user to save various views of a station with selected product configurations. For instance, a user may select a certain configuration of building products (e.g., particular options for doors, frames, glass, etc.) using the configuration menu 110, use the sliding control 120 to select different views of the station of the selected configuration displayed in a visualization 105 of the user interface, then save certain views by pressing the save scene button 140. The saved views may be associated with selected configuration (which also may be saved) and may be displayed in saved view slots 145-1, 145-2, 145-3, and 145-4 (collectively and generically referred to herein as saved view slots 145) located elsewhere in the user interface 100. (It can be noted that, although the illustrated embodiment includes four saved view slots 145, alternative embodiments may include a different number of slots, and the relative size and layout of the slots may vary.) In some embodiments, the saved views in view slots 145 may show the particular station, building products, and viewpoint selected by the user. In some embodiments, it may additionally show the saved view in a selected visualization mode (e.g., wireframe, false color, vector field, etc.) as well. In some embodiments, the user interface 100 may enable a user to capture a series of views which may be saved and/or exported as an animation in a video or animated Graphics Interchange Format (GIF) file. In some embodiments, an animation may be shown in a view slot 145, or may be shown elsewhere in the product literature portion 150 of the user interface 100. Embodiments allow a user to save and print various configurations, allowing a user to save a similar set of views, shown in the view slots 145, for various different configurations. This allows the user to provide richer experience to a client that allows the client to easily compare different configurations with similar viewpoints.

For a configuration selected by a user and shown in the visualization 105 of the user interface 100, details of the configuration can be provided in building product literature portion 150 of the user interface 100. It can be noted that the building product literature portion 150 of the user interface illustrated in FIG. 1A also includes the portions of the user interface 100-B and 100-C, illustrated in FIGS. 1B, and 1C, respectively. The details provided in the building product literature portion 150 can be saved (as a saved configuration), exported to any of a variety of electronic file formats, and/or printed.

Details regarding the selected configuration of the various building products can be provided in the configuration portion 155 of the user interface 100-B illustrated in FIG. 1B. Here, the various building products may be listed, and details (including a picture and/or textual description) regarding the selected options for each building product may be provided. In the embodiment illustrated in FIG. 1B, for example, selected building products are provided in rows. For each building product selected, the respective row includes a category of the building product type on the left-hand side, a picture, drawing, or other visual representation in the center (represented simply as a gray box in FIG. 1B), and a textual description of the selected building product on the right-hand side. Additional details regarding the selected configuration can be further provided in a details portion 160 of the user interface 100-C illustrated in FIG. 1C. These additional details can include narrative specifications, specifications in an industry-standard format such as those of the Construction Specifications Institute (CSI), and/or other specifications, as desired, as well as additional figures, performance details, and/or other details. For example, under the "performance" section of the details portion 160, tables, charts, text, and/or other written or graphical information may be provided to indicate performance metrics (e.g., indicative of one or more characteristics of the building material, such as structural integrity, thermal performance, acoustic performance, deflection, etc.).

Depending on desired functionality, the generated building product literature itself may be user configurable. For example, according to some embodiments, a user may be able to use the user interface to select a menu in which the user can create a template for the building product literature, indicating which details to include in the building product literature, and optionally how the details are to be arranged. Additionally or alternatively, a user may be able to choose from a selection of available templates. In some embodiments, the format of the building product literature and/or the available templates for the building product literature may be based, at least in part, on the types of building products selectable within the user interface 100. Literature for awnings and shutters, for example, may come in a different format than literature for glass products. Additionally or alternatively, the format of the building product literature may depend on the particular building product(s) selected by the user.

Whereas the embodiments discussed above may be of particular use to professionals, such as architects and contractors, alternative embodiments of the user interface may be adjusted to accommodate the needs of nonprofessionals, such as individual homeowners. In such embodiments, for example, the literature may comprise a summary of the building products selected by the user, product information more suited toward a homeowner, and/or an approximate cost of the configuration. Furthermore, the user interface may be able to provide contact information for contractors whom the user may contact to purchase and/or install one or more of the selected building products. In fact, in some embodiments, the user interface 100 may allow a user to automatically contact contractors, as discussed in more detail below.

To this end, the user interface 100 may be configured to gather additional information from a user. For example, the user interface 100 may allow a user to input information such as name, address, contact information, etc., which can enable the user interface 100 to relay this information to contractors, if the user so chooses. To allow for cost estimates, the user interface 100 may additionally gather information regarding a particular project, such as materials used and approximate dimensions.

Depending on desired functionality, the accuracy of the cost estimate may vary. For example, in some embodiments, the cost estimate may simply indicate an estimate falling within a broad range of costs (e.g., an "order of magnitude" estimate), which can be based on the configuration of building materials selected by the user and/or approximate installation costs. In some embodiments, the user interface 100 may allow the user to provide some additional information to provide extra granularity for the cost estimation. Such additional information could include, for example, a quantity of building products and/or approximate size of the project (e.g., "small," "medium," "large," etc.), which may be selectable via a menu (e.g., via a customization window 115 for a "project size" menu, or something similar). Some embodiments may allow for even more granularity by allowing a customer to input particular measurements and/or sizes. Depending on desired functionality, the visualization 105 may be updated to reflect these additional inputs from the user.

The estimated costs may be represented in any of a variety of ways, depending on the accuracy of the estimate, and/or other factors. For example, where a cost estimate would cover a broad range of values, icons could be used to represent different ranges (e.g., a number of dollar signs representing an amount of cost, different icons for different cost ranges, etc.). Alternatively (e.g., for more accurate cost estimates) ranges for actual monetary values could be provided.

Contractor information could be determined and provided to the user based on contractor information kept in a database. For example, a database of participating contractors (e.g., contractors having particular certifications and/or meeting other criteria) may be used. When a user uses the user interface 100 to select a configuration of building products and request contractor information for particular project, the user interface 100 may provide the contractor information based on address and/or other geographical information for the participating contractors in the database. For example, the user interface 100 may provide the user with a list of contractors within a certain distance from the project. (In some embodiments, this distance may be selectable by the user. E.g., contractors within a 10-mile radius, 25-mile radius, etc.) In some embodiments, this information may be provided in or below the building product information portion 150 of the user interface 110. This information may include, for example, name and contact information for each contractor.

Depending on desired functionality, the user interface 100 may also allow the user to contact one or more of the contractors. For example, in some embodiments, the user interface 100 may include a web form or similar interface to allow the user to select contractors to contact and submit the selection. The submission could trigger an email (or other form of contact) to the selected contractors with contact information for the user. The contractors may additionally be provided with information regarding the configuration of building products selected by the user for the project, the cost estimate provided by the user interface 100, comments and/or other information from the user, and/or the like. This can allow contractors to contact the user to confirm product selection and provide a more detailed bid for the project.

According to some embodiments, the user interface 100 may further provide a "comparison mode" in which different configurations may be compared. That is, the user interface 100 may enable a user to select two or more configurations (which may be saved), and compare them side by side. In the comparison mode, visualizations of the different configurations may be displayed side-by-side. Additionally or alternatively, the corresponding building product literature for the compared configurations may also be displayed side-by-side for easy comparison of similar details among the configurations.

Figure 2:
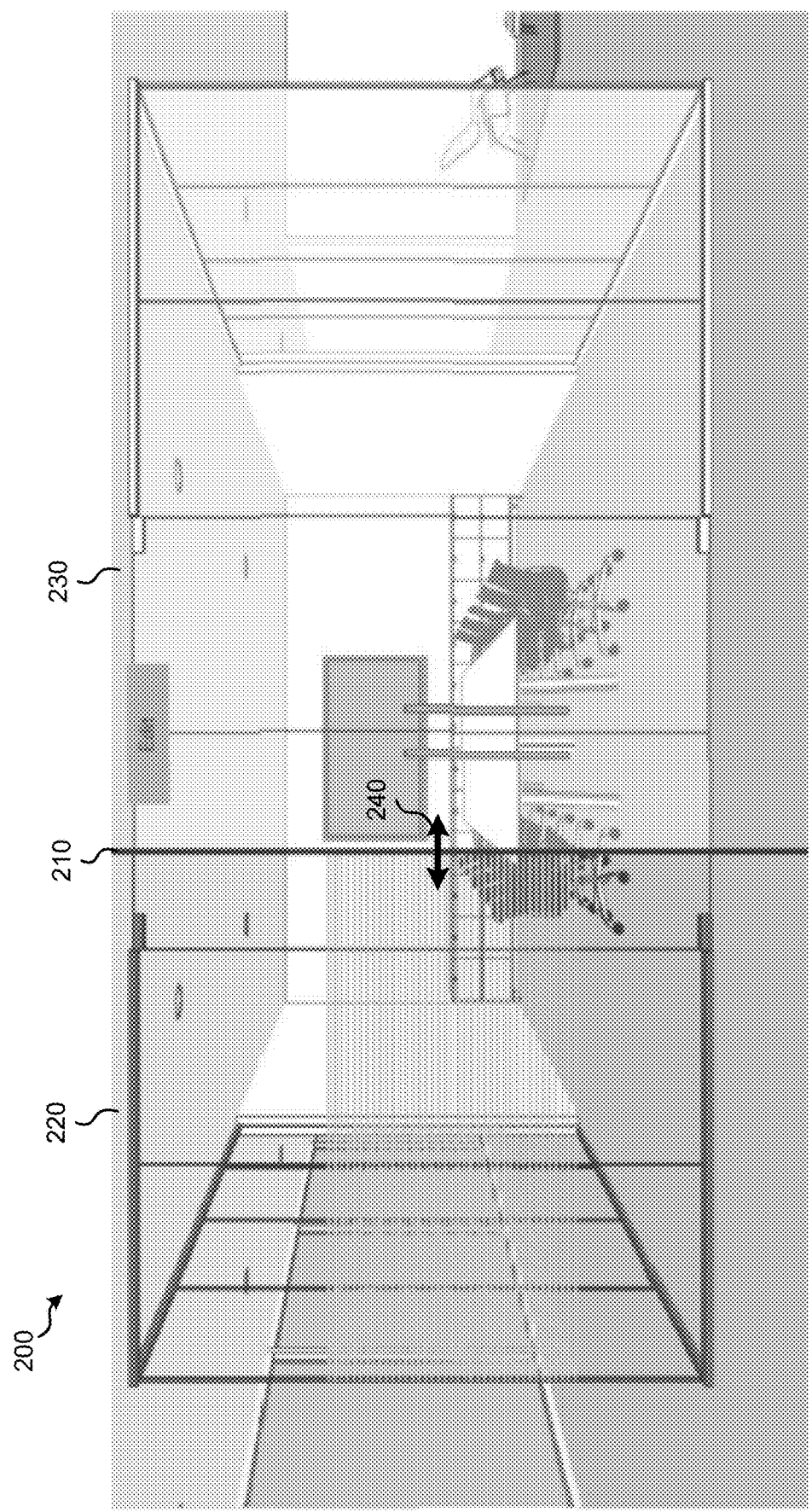
FIG. 2 is an illustration of a visualization provided in a comparison mode, according to an embodiment.

FIG. 2 is an illustration of a visualization 200 provided in a comparison mode, according to an embodiment. As noted above, this may be provided in the user interface 100 (e.g., as visualization 105 in FIG. 1A). Alternatively, the visualization 200 may be provided in a separate window or user interface.

In the embodiment illustrated in FIG. 2, the visualization 200 shows a single station having different building product configurations. A divider 210 separates the visualization 200 into a left-hand side 220 and the right-hand side 230, representing respective first and second configurations. A user may move the divider 210 left and right, as indicated by the arrows 240, which may help the user compare between configurations at different portions of the visualization 200.

Selecting the first and second (e.g., left-hand and right-hand) configurations to be done a variety of ways, depending on desired functionality. In some embodiments, for example, may select a side (e.g., by clicking or tapping a spot within the respective side of the visualization), then select different products to create the configuration (e.g., using a configuration menu, such as the configuration menu 110 of FIG. 1A). Additionally or alternatively, a user may be able to select a previously-saved configuration.

Alternative embodiments of a comparison mode may implement additional or alternative features, depending on desired functionality. In some embodiments, the divider 210 may not be adjustable. Additionally or alternatively, the divider 210 may be horizontal, rather than vertical, and may be adjustable along a vertical direction. In some embodiments whether the divider 210 is vertical or horizontal may be selectable by a user. Although comparing configurations using the same station and view can provide for an easier comparison in many instances, alternative embodiments may allow a user to compare different stations and/or views. (That is, the visualization 200 may show a different station and/or view on the left-hand side 220 then on the right-hand side 230.) In some embodiments, the comparison mode may allow a user to select different stations and/or views (for both the left-hand side 220 and right-hand side 230, or jointly for both sides). In some embodiments, the user can hover (e.g., with a mouse) between both halves of the view, causing a translucent gray layer to cover one of the configurations, depending on where a mouse cursor is located.

In some embodiments, the user interface 100 may provide similar functionality between different visualization modes. That is, a user may be able to configure a particular station, then select two different visualization modes (e.g., standard, schematic, wireframes, false color, etc.), which may be shown on left and right hand sides of a visualization, separated by a divider similar to divider 210.

Figure 3A:
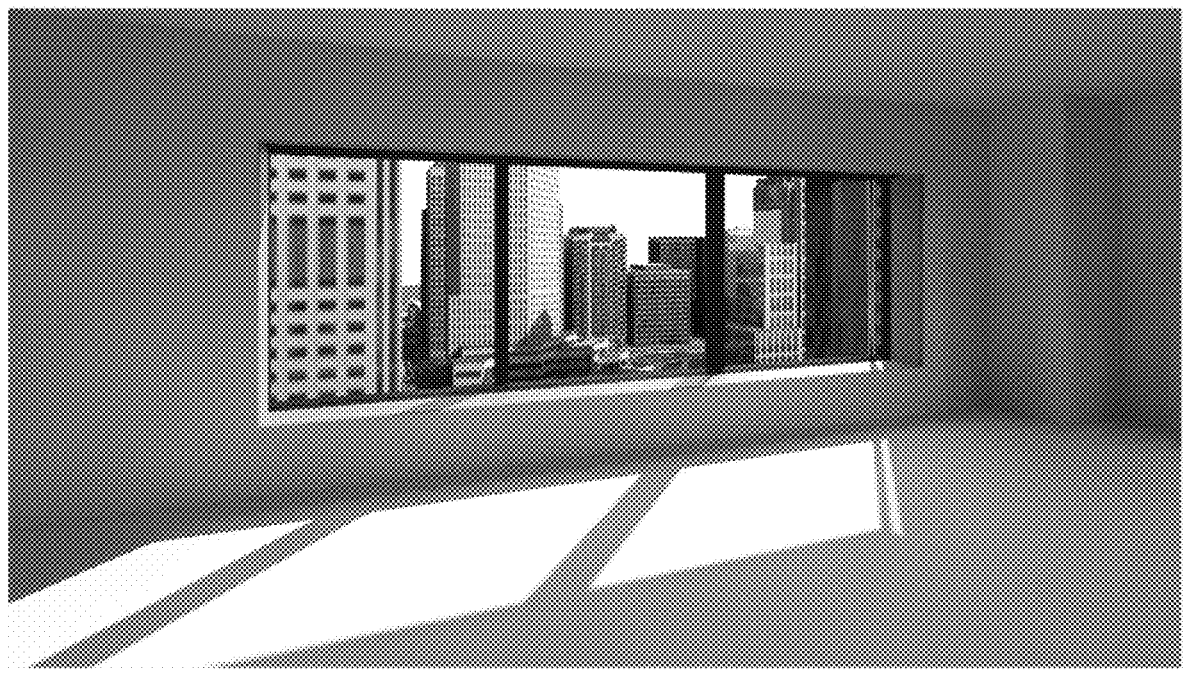
FIGS. 3A and 3B are illustrations of a scene (or station) viewed using alternative modes of visualization.
Figure 3B:
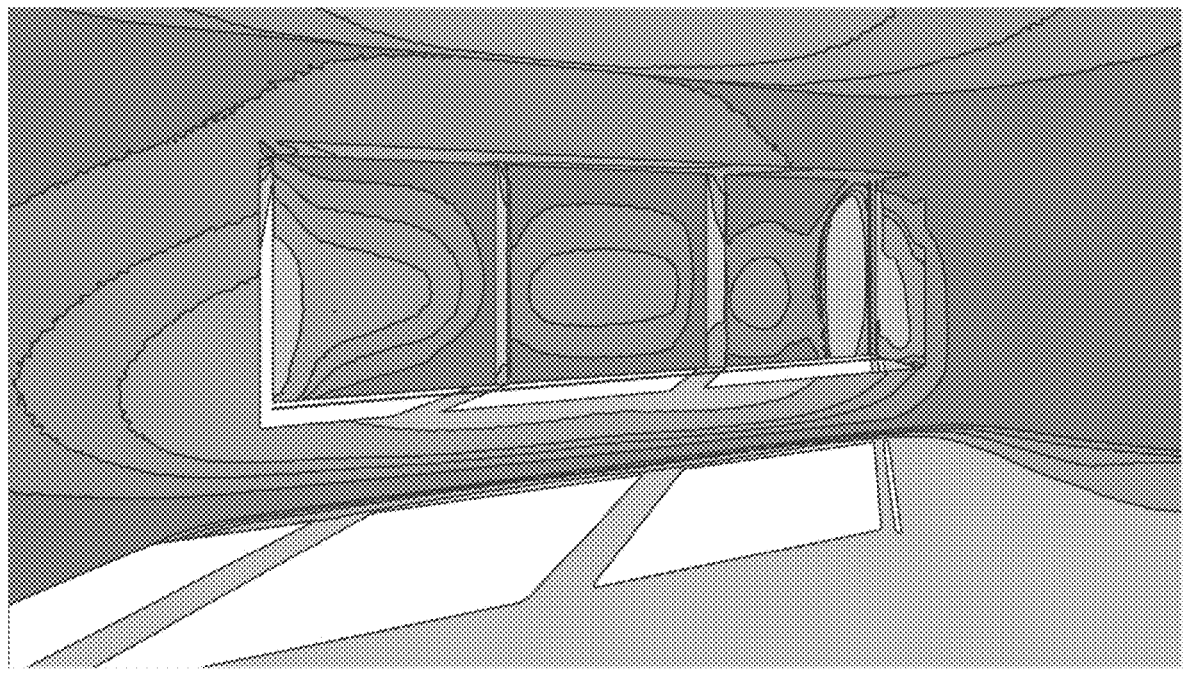

As previously noted, the user interface 100 can provide a visualization of product configurations for various stations using any of a variety of visualization modes. Visualization modes can vary, and can convey different types of data in different ways. FIGS. 3A and 3B are provided as an example of how standard and false-color visualization modes may do so.

FIG. 3A is an illustration of a scene using a standard mode of visualization. The standard mode of visualization represents a photorealistic view of the scene, which can provide the user with an understanding of how various building products in a selected configuration may look in a certain environment (e.g., using example environmental features, lighting, etc.).

FIG. 3B is an illustration of the same scene as in FIG. 3A, but using a false-color mode of visualization. (It will be understood that, although FIG. 3B is illustrated in grayscale, embodiments may replace the various shades of gray with various colors for enhanced contrast.) Here, the contour lines and varying shades indicate light the luminance levels for the scene in FIG. 3A. As previously noted, in alternative embodiments, false color may be used to convey additional or alternative data, including thermal absorption, transmittance, radiance, or the like. Moreover, depending on desired functionality, illuminance may be conveyed using modes of visualization other than false color images. Visualizations using false color and/or other visualization modes can convey valuable data that can further enhance the user accessibility offered by the user interface 100.

Figure 4:
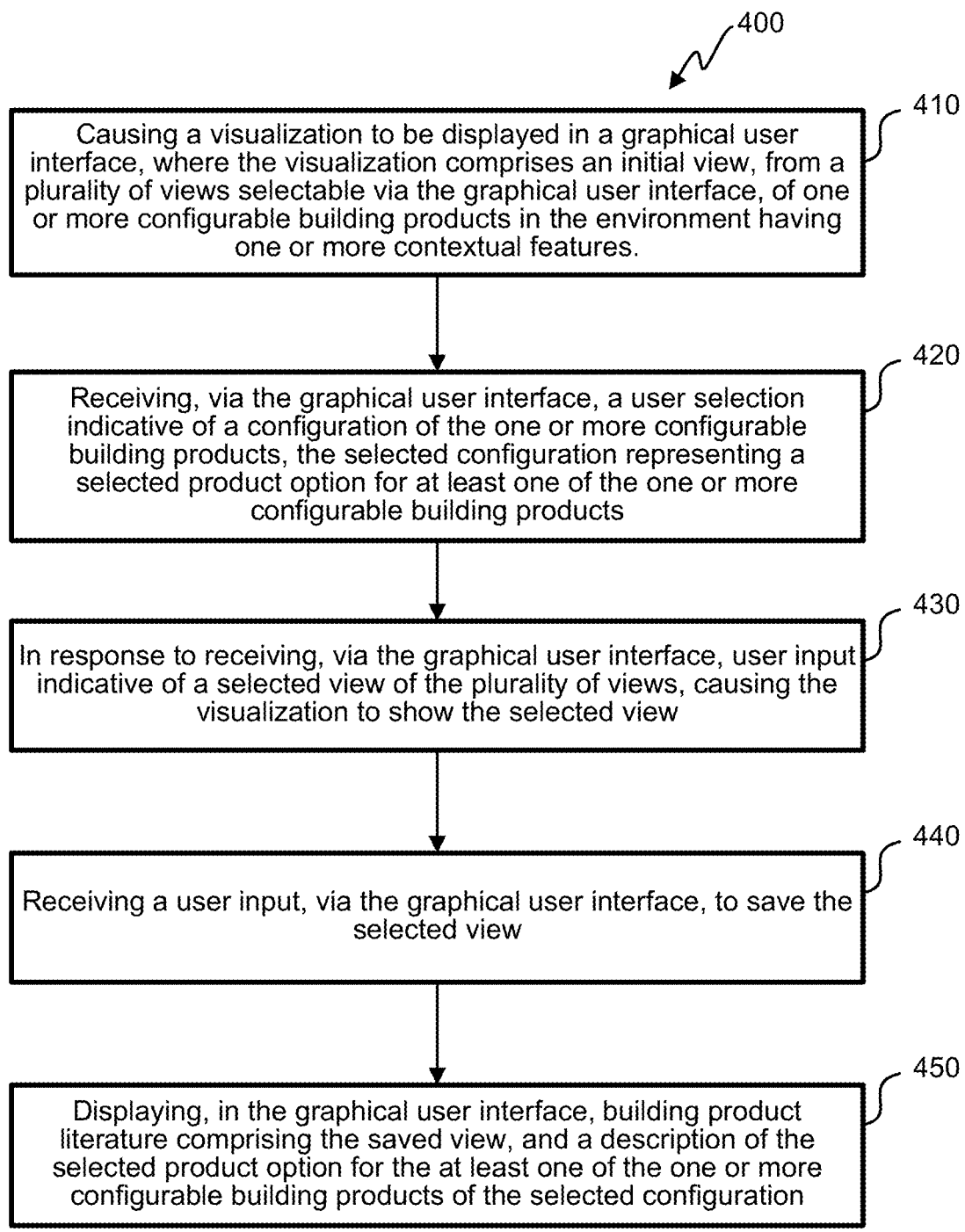
FIG. 4 is a flow diagram, illustrating a method of providing a user interface for creating building product literature, according to an embodiment.
Figure 5:
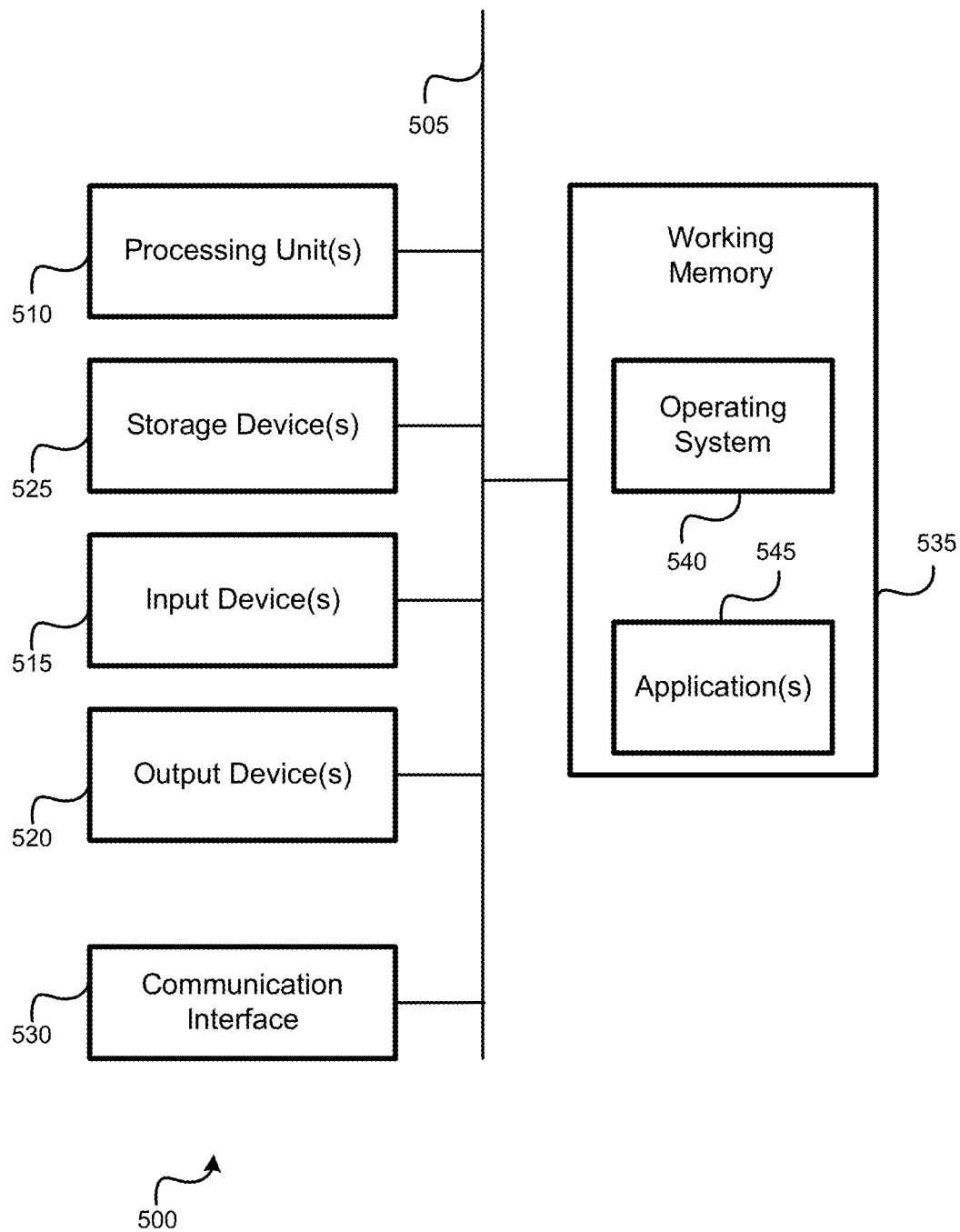
FIG. 5 is a block diagram of an embodiment of a computer system.

FIG. 4 is a flow diagram, illustrating a method of providing a user interface for creating, building product literature, according to an embodiment. Depending on desired functionality, all or portions of the method 400 can be implemented by a computer server (e.g., a Web server), an end-user device (e.g., a personal computer, tablet, mobile phone, etc.), or the like. As such, means for performing one or more of the functions of method 400 may comprise hardware and/or software components of a computer system 500 as illustrated in FIG. 5 and discussed in further detail below. As with other figures herein, FIG. 4 is provided as an example. Other embodiments may vary in functionality from the functionality shown. Variations may include performing additional functions, substituting functions, performing functions in a different order or simultaneously, and the like.

The functionality at block 410 comprises causing a visualization to be displayed in a graphical user interface, wherein the visualization comprises an initial view, from a plurality of views selectable via the graphical user interface, of one or more configurable building products in an environment having one or more contextual features. As described above, these building products may include configurable doors, frames, glass, etc. Contextual features may comprise surrounding materials, colors, and/or other features. The initial view may comprise a default view for the environment (station). In some embodiments, the default view may be configurable (e.g., defined in user preferences).

At block 420, the functionality includes receiving, via the graphical user interface, a user selection indicative of a configuration of the one or more configurable building products, where the selected configuration represents a selected product option for at least one of the one or more configurable building products. As noted in the embodiments described above, the products may vary in design, material, manufacture, and/or other characteristics, and these different characteristics may be selectable as options within the graphical user interface and displayed in the visualization once selected by a user.

Block 430 includes, in response to receiving, via the graphical user interface, user input indicative of a selected view of the plurality of views, causing the visualization to show the selected view. As previously described, the plurality of views may vary, depending on the visualization, and may include a series of images taken at different viewpoints, such as linear, orbital, or panoramic viewpoints.

At block 440, the functionality includes receiving a user input, via the graphical user interface, to save the selected view. As illustrated in FIG. 1A, for example, the saved view may be shown in a corresponding building product literature of the configuration, and may be one of a plurality of saved views that may be included in the building product literature.

At block 450, displaying, in the graphical user interface, building product literature comprising the saved view and a description of the selected product option for the at least one of the one or more configurable building products of the selected configuration. As noted above, the configuration detailed by the building product literature may be updated as different product options are selected. In some embodiments, a user may be able to scroll down at any time, within the user interface, to view the building product literature. According to some embodiments, the method 400 may further include enabling a user to, via the graphical user interface, save the selected configuration. It can be further noted that, it in various embodiments, the functionalities of saving views and saving configurations may be independent of one another. That is, a user may be able to save a view without necessarily saving a configuration. And likewise, a person may be able to save configuration without necessarily saving in view. (That said, other embodiments may combine these functions, if desired.)

It can be additionally noted that the graphical user interface may enable a user to retrieve a saved view and/or saved configuration. Moreover, similar to saving views and configurations, the functionalities of retrieving of a saved configuration or saved view may also be independent, or combined, depending on desired functionality. As indicated elsewhere herein, such retrieval of saved configurations and/or saved views may be made during a comparison. However, embodiments are not so limited. A user interface may enable the retrieval of a saved configuration and/or saved view, for example, regardless of whether a comparison to another saved configuration and/or saved view is being made.

Embodiments may include one or more additional features, depending on desired functionality. In some embodiments, the method 400 may further comprise obtaining a Uniform Resource Locator (URL) indicative of the saved configuration, and provide the URL to the user. This can allow the user to save the URL and/or share the URL with others. In fact, the user interface may allow a user to directly send the URL to others (via an email or text message, for example). Alternative embodiments may utilize other types of identifiers. In some embodiments, for example, a user may be given a code, password, or other identifier that can be used to retrieve a selected view and/or configuration. The identifier can subsequently be used by the user or another person with whom the user has shared the identifier. According to some embodiments sharing may additionally or alternatively take place between user accounts, where a person may give another account holder permissions to view, and optionally edit and/or delete, a saved configuration. As previously noted, according to some embodiments, the user interface may be provided in a website. Additionally or alternatively, the user interface may enable a user to alter a visual characteristic of at least one of the one or more contextual features, altering, for example, a material, color, texture, etc. of a contextual feature shown in the visualization. Some embodiments may enable a user to save alterations to the visual characteristics of the contextual features. Depending on desired functionality, these contextual feature customizations may be saved with a particular saved view, with a particular saved configuration, and/or independently as a global variable.

As noted previously, embodiments may also employ a comparison mode were different configurations may be compared. For instance, in some embodiments, the method 400 may further comprise enabling the user to select a first saved configuration and a second saved configuration, and displaying, in the graphical user interface, a visualization of the one or more configurable building products in the environment having the one or more contextual features such that a first portion of the visualization is displayed in accordance with the first saved configuration and a second portion of the visualization is displayed in accordance with the second saved configuration. In some embodiments, the first portion of the visualization and the second portion of the visualization may comprise a right-hand portion of the visualization and a left-hand portion of the visualization, respectively, as illustrated in FIG. 2 and described above. Additionally or alternatively, the method may comprise displaying an overlay image over the first portion of the visualization or the second portion of the visualization, based on a location of a mouse cursor within the graphical user interface. For instance, the overlay image may include a translucent image obscuring the first portion of the visualization or the second portion of the visualization, drawing attention to the opposite portion of the visualization. In some embodiments, the method 400 may further comprise enabling a user to adjust a border between the first portion of the visualization and the second portion of the visualization to grow or shrink the first portion of the visualization or the second portion of the visualization (e.g., by moving a divider, as discussed above with regard to FIG. 2).

FIG. 5 illustrates an embodiment of a computer system 500, which may be utilized and/or incorporated into an end user device, a computer server, and/or other device configured to perform one or more of the functions described herein. FIG. 5 provides a block diagram of one embodiment of a computer system 500 that can perform the methods provided by various other embodiments, such as the 400 of FIG. 4. It should be noted that FIG. 5 is meant only to provide a generalized illustration of various components, any or all of which may be utilized as appropriate. FIG. 5, therefore, broadly illustrates how individual system elements may be implemented in a relatively separated or relatively more integrated manner. In addition, it can be noted that components illustrated by FIG. 5 can be localized to a single device and/or distributed among various networked devices, which may be disposed at different physical or geographical locations.

The computer system 500 is shown comprising hardware elements that can be electrically coupled via a bus 505 (or may otherwise be in communication, as appropriate). The hardware elements may include processing unit(s) 510, which can include without limitation one or more general-purpose processors, one or more special-purpose processors (such as digital signal processing chips, graphics acceleration processors, and/or the like), and/or other processing structure, which can be configured to perform one or more of the methods described herein, including the method described in relation to FIG. 4. The computer system 500 also can include one or more input devices 515, which can include without limitation a mouse, a keyboard, a camera, a microphone, a touchscreen display, and/or the like; and one or more output devices 520, which can include without limitation a display device, a printer, and/or the like.

The computer system 500 may further include (and/or be in communication with) one or more non-transitory storage devices 525, which can comprise, without limitation, local and/or network accessible storage, and/or can include, without limitation, a disk drive, a drive array, an optical storage device, a solid-state storage device, such as a random access memory ("RAM"), and/or a read-only memory ("ROM"), which can be programmable, flash-updateable, and/or the like. Such storage devices may be configured to implement any appropriate data stores, including without limitation, various file systems, database structures, and/or the like.

The computer system 500 may also include a communication interface 530, which can include support of wireline communication technologies and/or wireless communication technologies (in some embodiments). The communication interface 530 may include a modem, a network card (wireless or wired), an infrared communication device, a wireless communication device, and/or a chipset, and/or the like. The communication interface 530 may include one or more input and/or output communication interfaces to permit data and signaling to be exchanged with a network, mobile devices, other computer systems, and/or any other electronic devices described herein.

In many embodiments, the computer system 500 will further comprise a working memory 535, which can include a RAM and/or or ROM device. Software elements, shown as being located within the working memory 535, can include an operating system 540, device drivers, executable libraries, and/or other code, such as application(s) 545, which may comprise computer programs provided by various embodiments, and/or may be designed to implement methods, and/or configure systems, provided by other embodiments, as described herein. Merely by way of example, one or more procedures described with respect to the method(s) discussed above, such as the method described in relation to FIG. 4, may be implemented as code and/or instructions that are stored (e.g. temporarily) in working memory 535 and are executable by a computer (and/or a processing unit within a computer such as processing unit(s) 510); in an aspect, then, such code and/or instructions can be used to configure and/or adapt a general purpose computer (or other device) to perform one or more operations in accordance with the described methods.

A set of these instructions and/or code might be stored on a non-transitory computer-readable storage medium, such as the storage device(s) 525 described above. In some cases, the storage medium might be incorporated within a computer system, such as computer system 500. In other embodiments, the storage medium might be separate from a computer system (e.g., a removable medium, such as an optical disc), and/or provided in an installation package, such that the storage medium can be used to program, configure, and/or adapt a general purpose computer with the instructions/code stored thereon. These instructions might take the form of executable code, which is executable by the computer system 500 and/or might take the form of source and/or installable code, which, upon compilation and/or installation on the computer system 500 (e.g., using any of a variety of generally available compilers, installation programs, compression/decompression utilities, etc.), then takes the form of executable code.

Various components described herein, are described as being "configured" to perform various operations. Those skilled in the art will recognize that, depending on implementation, such configuration can be accomplished through design, setup, placement, interconnection, and/or programming of the particular components and that, again depending on implementation, a configured component might or might not be reconfigurable for a different operation. Moreover, for many functions described herein, specific means have also been described as being capable of performing such functions. It can be understood, however, that functionality is not limited to the means disclosed. A person of ordinary skill in the art will appreciate that alternative means for performing similar functions may additionally or alternatively be used to those means described herein.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter.

The terms "and," "or," and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter may also include all aspects falling within the scope of appended claims, and equivalents thereof.

What is claimed is:

1. A method of providing a user interface for creating building product literature, the method comprising:
    causing a visualization to be displayed in a first portion of a graphical user interface, wherein the visualization comprises an initial view, from a plurality of views selectable via the graphical user interface, of one or more configurable building products in an environment, wherein:
        each view of the plurality of views shows the one or more configurable building products in the environment from a different perspective, and
        the environment has one or more contextual features;
    receiving, via the graphical user interface, a user selection indicative of a configuration of the one or more configurable building products, the selected configuration representing a selected product option for at least one of the one or more configurable building products;
    enabling a user to select a first saved configuration and a second saved configuration of the one or more configurable building products for comparison;
    causing a new visualization to be displayed via the graphical user interface, the environment having the one or more contextual features such that a first portion of the visualization is displayed in accordance with the first saved configuration and a second portion of the visualization is displayed in accordance with the second saved configuration;
    in response to receiving, via the graphical user interface, a first user input indicative of a selected view of the plurality of views, causing the visualization to show the selected view;
    receiving a second user input, via the graphical user interface, to save the selected view;
    causing the graphical user interface to display, within a second portion separate from the visualization displayed in the first portion of the graphical user interface, building product literature comprising:
        a saved view comprising an image capture or animation of the selected view and located in a view slot portion of the building product literature, and
        a description of the selected product option for the at least one of the one or more configurable building products of the selected configuration; and
    responsive to receiving a third user input via the graphical user interface, performing an operation comprising:
        saving the building product literature,
        exporting the building product literature to an electric file format, or
        printing the building product literature, or
        a combination thereof.

2. The method of claim 1, further comprising:
    obtaining a Uniform Resource Locator (URL) indicative of saved building product literature; and
    providing the URL to the user.

3. The method of claim 1, further comprising enabling the user to, via the graphical user interface, alter a visual characteristic of at least one of the one or more contextual features.

4. The method of claim 1, wherein the plurality of views comprises a series of images taken at different linear, orbital, or panoramic viewpoints of the environment.

5. The method of claim 1, wherein the first portion of the visualization and the second portion of the visualization comprise a right-hand portion of the visualization and a left-hand portion of the visualization, respectively.

6. The method of claim 1, further comprising causing an overlay image to be displayed over the first portion of the visualization or the second portion of the visualization, based on a location of a mouse cursor within the graphical user interface.

7. The method of claim 1, enabling the user to adjust a divider between the first portion of the visualization and the second portion of the visualization to grow or shrink the first portion of the visualization or the second portion of the visualization.

8. The method of claim 1, further comprising:
determining a cost estimate based on the selected configuration; and
displaying, in the graphical user interface, the determined cost estimate.

9. The method of claim 1, further comprising:
receiving user information via the graphical user interface;
identifying one or more contractors based on the user information; and
displaying, in the graphical user interface, contact information for the one or more contractors.

10. The method of claim 9, further comprising causing the user information to be sent to the one or more contractors.

11. The method of claim 1, wherein the environment is one of a plurality of selectable environments displayable by the graphical user interface, and wherein each environment of the plurality of selectable environments has:
a respective plurality of views selectable via the graphical user interface, and
respective one or more contextual features.

12. The method of claim 1, wherein the saved view and the description of the selected product option of the building product literature are displayed in accordance with a first template, and wherein the method further comprises providing, in the graphical user interface, a menu for selecting or creating a second template.

13. A computer system comprising:
a memory; and
a processing unit communicatively coupled with the memory and configured to:
cause a visualization to be displayed in a first portion of a graphical user interface, wherein the visualization comprises an initial view, from a plurality of views selectable via the graphical user interface, of one or more configurable building products in an environment wherein:
each view of the plurality of views shows the one or more configurable building products in the environment from a different perspective, and
the environment has one or more contextual features;
receive a user selection via the graphical user interface, wherein:
the user selection is indicative of a configuration of the one or more configurable building products, and
the selected configuration represents a selected product option for at least one of the one or more configurable building products;
enabling a user to select a first saved configuration and a second saved configuration of the one or more configurable building products for comparison;
cause a new visualization to be displayed via the graphical user interface, the new visualization comprising the one or more configurable building products in the environment having the one or more contextual features such that a first portion of the visualization is displayed in accordance with the first saved configuration and a second portion of the visualization is displayed in accordance with the second saved configuration;
in response to receiving, via the graphical user interface, a first user input indicative of a selected view of the plurality of views, cause the visualization to show the selected view;
receive a second user input, via the graphical user interface, to save the selected view;
cause the graphical user interface to display, within a second portion separate from the visualization displayed in the first portion of the graphical user interface, building product literature comprising:
a saved view comprising an image capture or animation of the selected view and located in a view slot portion of the building product literature, and
a description of the selected product option for the at least one of the one or more configurable building products of the selected configuration; and
responsive to receiving a third user input via the graphical user interface, perform an operation comprising:
saving the building product literature,
exporting the building product literature to an electric the format, or
printing the building product literature, or
a combination thereof.

14. The computer system of claim 13, wherein the processing unit is further configured to:
determine a cost estimate based on the selected configuration; and
cause the graphical user interface to display the determined cost estimate.

15. The computer system of claim 13, wherein the processing unit is further configured to:
receive user information via the graphical user interface;
identify one or more contractors based on the user information; and
cause the graphical user interface to display contact information for the one or more contractors.

16. The computer system of claim 15, wherein the processing unit is further configured to cause the user information to be sent to the one or more contractors.

17. The computer system of claim 13, wherein the environment is one of a plurality of selectable environments displayable by the graphical user interface, and wherein each environment of the plurality of selectable environments has:
a respective plurality of views selectable via the graphical user interface, and
respective one or more contextual features.

18. The computer system of claim 13, wherein the processing unit is configured to display the saved view and the description of the selected product option of the building product literature in accordance with a first template, and wherein the processing unit is further configured to provide, in the graphical user interface, a menu for selecting or creating a second template.

* * * * *